(12) United States Patent
Jung et al.

(10) Patent No.: US 8,035,176 B2
(45) Date of Patent: Oct. 11, 2011

(54) MEMS PACKAGE AND PACKAGING METHOD THEREOF

(75) Inventors: Sung-Hae Jung, Daejeon (KR); Myung-Lae Lee, Daejeon (KR); Gunn Hwang, Seoul (KR); Chang-Kyu Kim, Daejeon (KR); Chang-Han Je, Jinju (KR); Chang-Auck Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 98 days.

(21) Appl. No.: 12/517,557

(22) PCT Filed: Jul. 25, 2007

(86) PCT No.: PCT/KR2007/003562
§ 371 (c)(1),
(2), (4) Date: Jun. 4, 2009

(87) PCT Pub. No.: WO2008/069394
PCT Pub. Date: Jun. 12, 2008

(65) Prior Publication Data
US 2010/0096713 A1    Apr. 22, 2010

(30) Foreign Application Priority Data
Dec. 7, 2006    (KR) .................. 10-2006-0124132

(51) Int. Cl.
*H01L 29/84* (2006.01)
*H01L 21/00* (2006.01)
(52) U.S. Cl. ........ 257/415; 257/417; 257/418; 257/419; 257/420; 257/E29.324; 438/50; 438/52; 438/53

(58) Field of Classification Search .................. 257/415, 257/417, 418, 419, 420, E29.324; 438/50, 438/52, 53
See application file for complete search history.

(56) References Cited

U.S. PATENT DOCUMENTS

| | | | |
|---|---|---|---|
| 6,405,592 B1 * | 6/2002 | Murari et al. | 73/493 |
| 6,633,426 B2 * | 10/2003 | Shrauger et al. | 359/290 |
| 6,841,839 B2 * | 1/2005 | Sridhar et al. | 257/415 |
| 6,872,902 B2 * | 3/2005 | Cohn et al. | 200/181 |
| 6,922,499 B2 | 7/2005 | Boie et al. | |
| 7,012,327 B2 * | 3/2006 | Huff et al. | 257/686 |

(Continued)

FOREIGN PATENT DOCUMENTS
KR    100231711 B1    8/1999
(Continued)

OTHER PUBLICATIONS

Huikai Xie et al., "Vertical comb-finger capacitive actuation and sensing for CMOS-MEMS," Sensor and Actuator A 95, 2002, pp. 212-221.

(Continued)

*Primary Examiner* — Ida M Soward

(57) ABSTRACT

Provided are a Micro Electro-Mechanical System (MEMS) package and a method of packaging the MEMS package. The MEMS package includes: a MEMS device including MEMS structures formed on a substrate, first pad electrodes driving the MEMS structures, first sealing parts formed at an edge of the substrate, and connectors formed on the first pad electrodes and the first sealing parts; and a MEMS driving electronic device including second pad electrodes and second sealing parts respectively corresponding to the first pad electrodes and the first sealing parts to be sealed with and bonded to the MEMS device through the connectors to form an air gap having a predetermined width.

15 Claims, 8 Drawing Sheets

U.S. PATENT DOCUMENTS

| | | | |
|---|---|---|---|
| 7,250,112 B2 * | 7/2007 | Nasiri et al. | 216/2 |
| 7,579,848 B2 * | 8/2009 | Bottoms et al. | 324/756.03 |
| 7,581,443 B2 * | 9/2009 | Kubena et al. | 73/504.12 |
| 2003/0054584 A1 | 3/2003 | Hinzel et al. | |
| 2004/0043423 A1 * | 3/2004 | Bellew et al. | 435/7.1 |
| 2006/0164710 A1 * | 7/2006 | Fujii et al. | 359/224 |
| 2007/0216987 A1 * | 9/2007 | Hagood et al. | 359/298 |
| 2007/0297037 A1 * | 12/2007 | Khonsari et al. | 359/290 |
| 2010/0027577 A1 * | 2/2010 | Dutta | 372/50.1 |

FOREIGN PATENT DOCUMENTS

| | | | |
|---|---|---|---|
| KR | 1020000018926 A | 4/2000 | |
| KR | 1020000030966 A | 6/2000 | |
| KR | 1020050118081 A | 12/2005 | |
| KR | 1020060090021 A | 8/2006 | |
| KR | 1020070038398 A | 4/2007 | |

OTHER PUBLICATIONS

Babak Vakili Amini et al., "A 2.5-V 14-bit ΣΔCMOS SOI Capacitive Accelerometer," IEEE Journal of Solid-State Circuit, Dec. 2004, pp. 2467-2476, vol. 39, No. 12.

International Search Report for PCT/KR2007/003562 filed on Jul. 25, 2007.

Written Opinion of the International Searching Authority for PCT/KR2007/003562 filed on Jul. 25, 2007.

* cited by examiner

MEMS PACKAGE AND PACKAGING METHOD THEREOF

TECHNICAL FIELD

The present invention relates to a Micro Electro-Mechanical System (MEMS) package and a packaging method thereof, and more particularly, to a package of an MEMS device and an electronic device for driving the MEMS device and a packaging method thereof.

BACKGROUND ART

The methods of connecting a Micro Electro-Mechanical system (MEMS) device to an electronic device for driving the MEMS device (a driving circuit device), e.g., an application specific integrated circuit (ASIC) chip, can be classified into three types.

In a first method, an upper, lower, or side portion of a packaged MEMS device is connected to an MEMS driving electronic device using Au wire bonding. In a second method, the packaged MEMS device is bonded to the MEMS driving electronic device using flip-chip bonding. In a third method, the MEMS device and the MEMS driving electronic device are manufactured on a wafer and then connected to each other using electrodes.

However, in the first method, a difference in electrical characteristics occurs between a designed MEMS device and a manufactured MEMS device due to a parasitic resistance, a parasitic capacitance, etc. caused by the wire bonding. In particular, if the MEMS device is a circuit detecting a capacitance to be driven, a signal-to-noise ratio (SNR) is reduced due to the wire bonding which reduces the entire electrical characteristics of the MEMS device. In the second method, the parasitic capacitance and resistance, etc. may be reduced. However, the MEMS device is packaged and then bonded to the MEMS driving electronic device. Thus, a chip level package may be manufactured, but a wafer level package may not be manufactured. In the third method, if the MEMS device and the MEMS driving electronic device are manufactured on a wafer using the same method, losses caused by a package may be reduced.

However, in the third method, yield may be more reduced than when the MEMS device and the MEMS driving electronic device are manufactured on different wafers, due to yield variables of the MEMS device and the MEMS driving electronic device. In other words, the third method requires large amounts of cost and time to mass-produce MEMS chips and MEMS driving electronic devices.

DISCLOSURE OF INVENTION

Technical Solution

The present invention provides a Micro Electro-Mechanical System (MEMS) package capable of reducing effects of a parasitic resistance and a parasitic capacitance, enabling chip level or wafer level packaging, and preventing a reduction in a manufacturing yield.

The present invention also provides a method of easily packaging an MEMS package.

According to an aspect of the present invention, there is provided a Micro Electro-Mechanical System (MEMS) package including: a MEMS device including MEMS structures formed on a substrate, first pad electrodes driving the MEMS structures, first sealing parts formed at an edge of the substrate, and connectors formed on the first pad electrodes and the first sealing parts; and a MEMS driving electronic device including second pad electrodes and second sealing parts respectively corresponding to the first pad electrodes and the first sealing parts to be sealed with and bonded to the MEMS device through the connectors to form an air gap having a predetermined width.

According to another aspect of the present invention, there is provided a method of packaging an MEMS device and an MEMS driving electronic device, including: forming MEMS structures above a substrate, forming first pad electrodes driving the MEMS structures, and forming first sealing parts at an edge of the substrate; forming connectors on the first pad electrodes and the first sealing parts to form the MEMS device; and sealing the MEMS driving electronic device with and bonding the MEMS driving electronic device to the MEMS device through the connectors to form an air gap having a predetermined width, wherein the MEMS driving electronic device includes second pad electrodes and second sealing parts respectively corresponding to the first pad electrodes and the first sealing parts.

Advantageous Effects

An MEMS device of the present invention can be directly bonded to an MEMS driving electronic device to improve yield. Also, an MEMS package can be manufactured on a wafer or chip level. In addition, effects of a parasitic resistance and a parasitic capacitance can be reduced to reduce the SNR of the MEMS device. Moreover, the MEMS device can be packaged and then bonded to the MEMS driving electronic device so as to realize a dual package structure. Thus, time and cost required for packaging can be saved to improve productivity.

BRIEF DESCRIPTION OF THE DRAWINGS

The above and other features and advantages of the present invention will become more apparent by describing in detail exemplary embodiments thereof with reference to the attached drawings in which.

MODE FOR THE INVENTION

Figure 1:
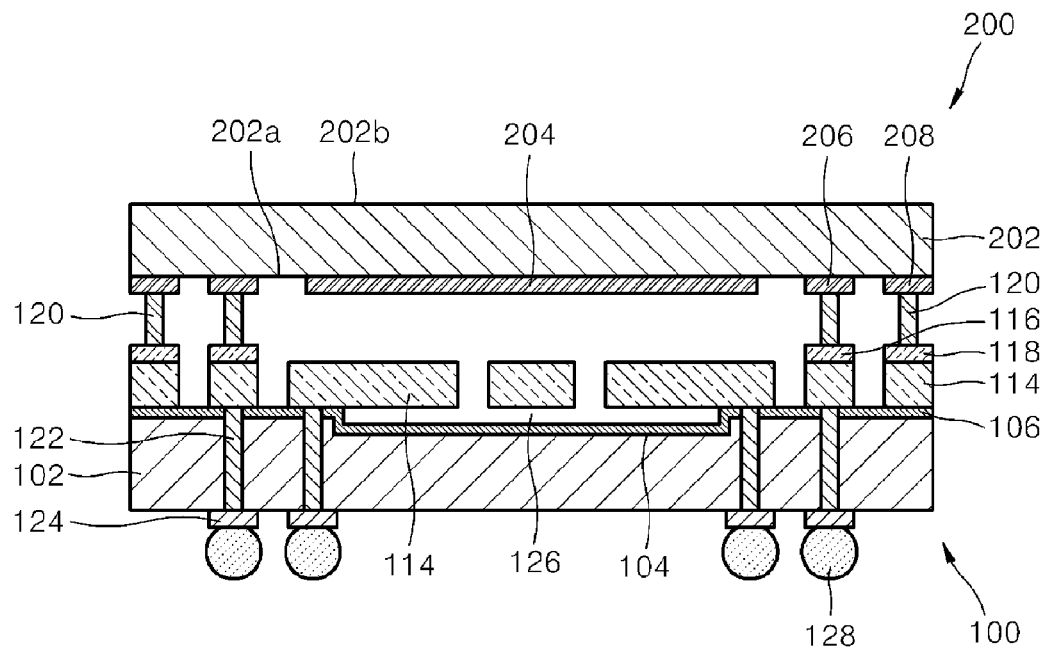
FIG. 1 is a cross-sectional view of a Micro Electro-Mechanical System (MEMS) package according to an embodiment of the present invention.

Hereinafter, the present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

In the present invention a Micro Electro-Mechanical System (MEMS) device and an MEMS driving electronic device are directly bonded to each other to face each other so as to package an MEMS package. Furthermore, various methods may be used to package the MEMS package, and an order of packaging the MEMS package is not limited but may be varied. Embodiments of the present invention will now be described with reference to the attached drawings.

FIG. 1 is a cross-sectional view of an MEMS package according to an embodiment of the present invention. Referring to FIG. 1, the MEMS package according to the present embodiment includes an MEMS device 100 and an MEMS driving electronic device 200. The MEMS device 100 includes a silicon substrate 102, e.g., a silicon wafer, and a recessed part 104 which is formed by selectively etching the silicon substrate 102. A passive layer 106 is formed on an inner wall of the recessed part 104 and on the silicon substrate 102. The passive layer 106 is formed of a low temperature oxide (LTO).

MEMS structures 114 are formed above the recessed part 104. Thus, the MEMS structures 114 are separated from the recessed part 104 by a space part 126. In other words, the MEMS structures 114 are spatially separated from the recessed part 104. The MEMS structures 114 are formed of a silicon nitride pattern or a polysilicon pattern. First pad electrodes 116 and first sealing parts 118 are formed on the MEMS structures 114 on the passive layer 106.

The first pad electrodes 116 are formed around the MEMS structures 114 formed above the recessed part 104 to be used to drive the MEMS structures 114. The first sealing parts 118 are formed at the edge of the silicon substrate 102. The first sealing parts 118 are used to seal the MEMS device 100 with the MEMS driving electronic device 200. The MEMS structures 114 may be accelerometer or a gyroscope in a comb shape form, and be driven by change of capacitance. The MEMS structures 114 may be driven through a change in resistance or driven by a driving chip including a converter converting a resistance change into a voltage or a resistance-voltage (R-V) converter and an analog-to-digital converter (ADC). Connectors 120 are formed on the first pad electrodes 116 and the first sealing parts 118. The connectors 120 are formed of a conductive layer, e.g., Au, AuSn, or metal.

Vias 122 are formed in the passive layer 106 and the silicon substrate 102 under the MEMS structures 114, and an external substrate (not shown), third pad electrodes 124, and metal balls 128 are formed on the vias 122. The vias 122 may be formed of a conductive material such as gold, copper, conductive powder, solder, or the like. In FIG. 1, the first pad electrodes 116 are not connected to the vias 122 but are connected to other parts of the silicon substrate 102.

The MEMS driving electronic device 200 includes a substrate 202 having front and back surfaces 202a and 202b. A chip part 204 is installed on the front surface 202a, second pad electrodes 206 are formed around the chip part 204, and second sealing parts 208 are formed at an edge of the substrate 202. The second sealing parts 208 are used to seal the MEMS 100 and the MEMS driving electronic device 200 together. The chip part 204 may include a capacitance-voltage (C-V) converter or an ADC.

The MEMS driving electronic device 200 includes the second pad electrodes 206 and the second sealing parts 208 respectively corresponding to the first pad electrodes 116 and the first sealing parts 118. The second pad electrodes 206 and the second sealing parts 208 of the MEMS driving electronic device 200 are respectively connected to the first pad electrodes 116 and the first sealing parts 118 through the connectors 120. The MEMS driving electronic device 200 is sealed to and bonded to the MEMS device 100 through the connectors 120 to form an air gap having a predetermined width. Thus, the MEMS device 100 and the MEMS driving electronic device 200 may be sealed in a vacuum state. A gas may be filled between the MEMS device 100 and the MEMS driving electronic device 200 to seal the MEMS device 100 and the MEMS driving electronic device 200.

FIGS. 2 through 8 are cross-sectional views illustrating a method of packaging the MEMS package of FIG. 1.

Figure 6:
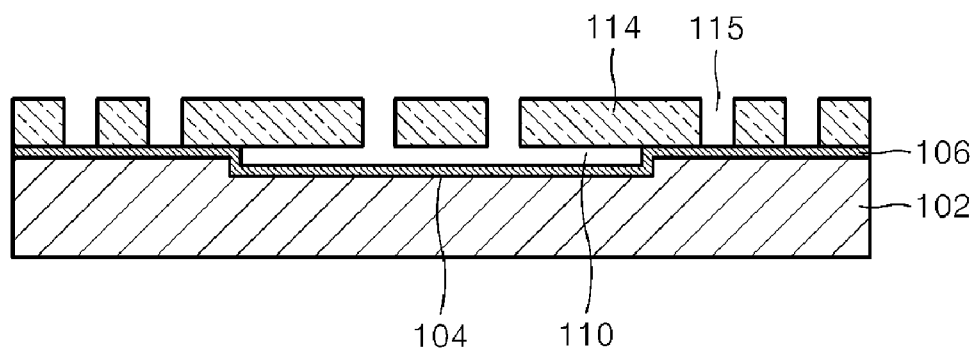
Figure 7:
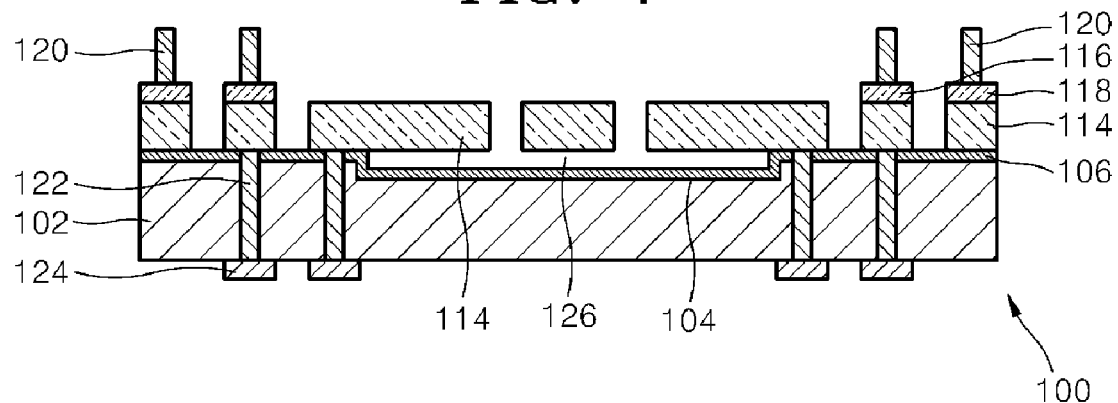
Figure 8:
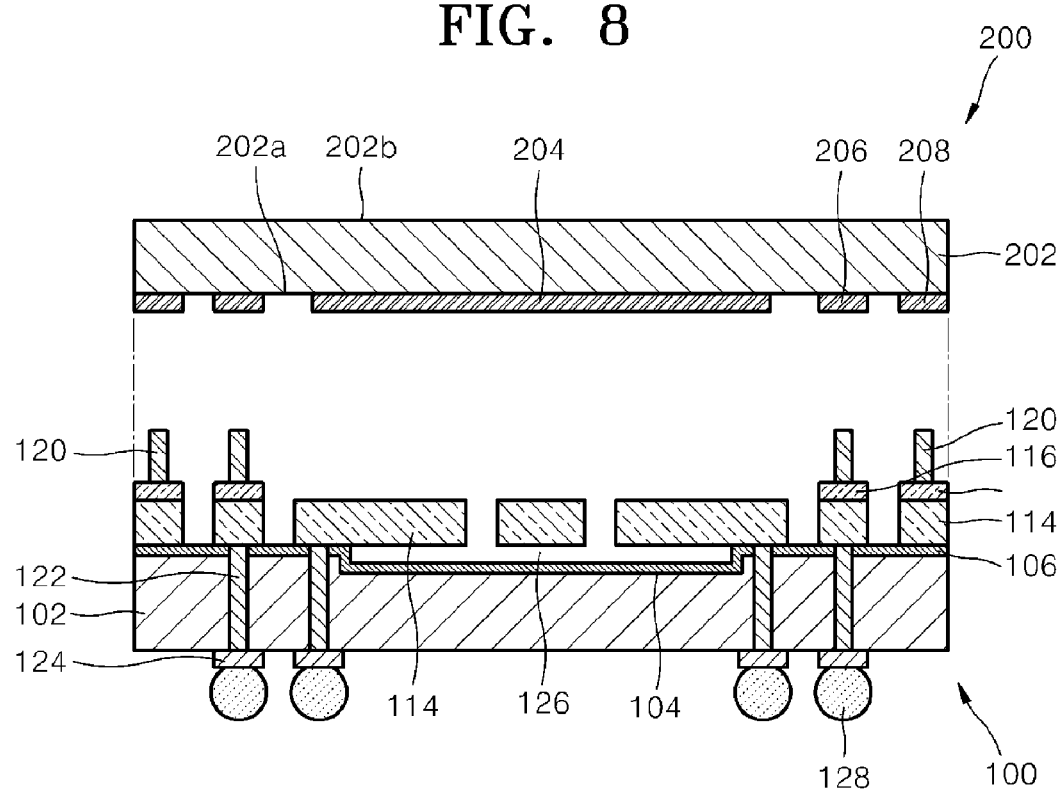

In detail, FIGS. 2 through 7 are cross-sectional views illustrating a method of manufacturing an MEMS device, and FIG. 8 is a cross-sectional view illustrating a method of bonding the MEMS device to an MEMS driving electronic device.

Figure 2:
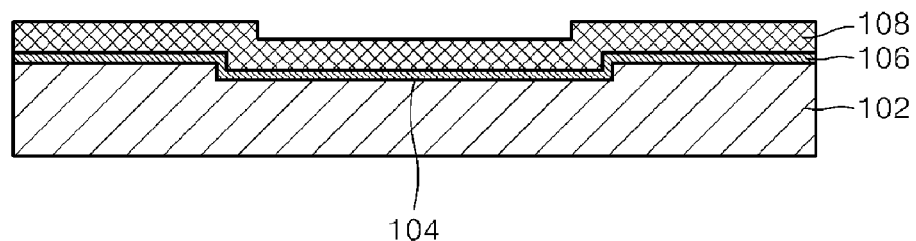
FIGS. 2 through 8 are cross-sectional views illustrating a method of packaging the MEMS package of FIG. 1.

Referring to FIG. 2, a portion of the silicon substrate 202 is selectively etched to form the recessed part 104. The passive layer 107, e.g., formed of LTO, is formed on a surface of the recessed part 104 and the silicon substrate 202. A sacrificial layer 108 is formed on the passive layer 106 to completely fill the recessed part 104. The sacrificial layer 108 is formed of polysilicon or oxide.

Figure 3:
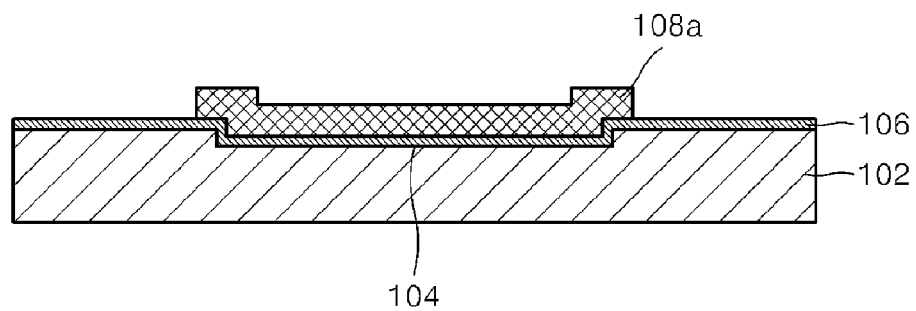
Figure 4:
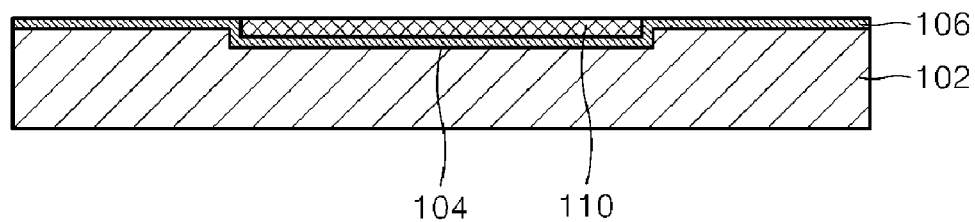

Referring to FIG. 3, the sacrificial layer 108 is patterned to form a patterned sacrificial layer 108a. Referring to FIG. 4, the patterned sacrificial layer 108a is planarized using chemical mechanical polishing (CMP) to reduce a step difference between the silicon substrate 102 and the patterned sacrificial layer 108a. Thus, a filling sacrificial layer 110 is formed inside the recessed part 104.

Figure 5:
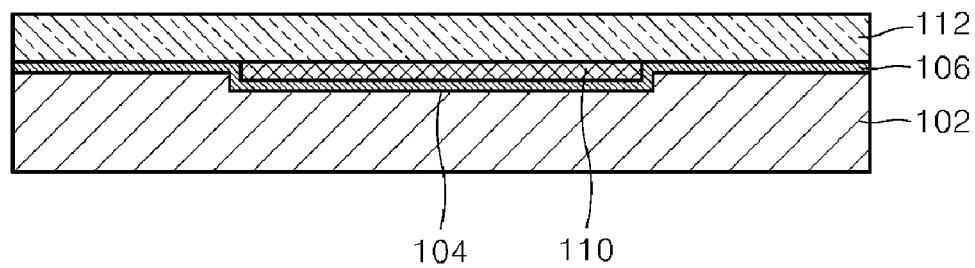

Referring to FIG. 5, an MEMS structure layer 112 is formed on the filling sacrificial layer 110 and the silicon substrate 102. If the filling sacrificial layer 110 is formed of polysilicon, the MEMS structure layer 112 is formed of silicon nitride. If the filling sacrificial layer 110 is formed of oxide, the MEMS structure layer 112 is formed of polysilicon. Referring to FIG. 6, the MEMES structure layer 112 is patterned to form the MEMS structures 114. Here, holes 115 are formed between the MEMS structures 114 on the passive layer 106 and the filling sacrificial layer 110 filled inside the recessed part 104.

Referring to FIG. 7, the first pad electrodes 116 and the first sealing parts 118 are formed on the MEMS structures 114. The silicon substrate 102 and the passive layer 106 are selectively etched to form the vias 122 from a back surface of the silicon substrate 102. Deep reactive etch (DRIE) is selectively performed on the rear surface of the silicon substrate 102 to form viaholes, and then a conductive material is filled in the viaholes so as to form the vias 122.

The third pad electrodes 124 are formed on the vias 122. The filling sacrificial layer 110 is removed to form the space part 126 below the MEMS structures 114. If the filling sacrificial layer 110 is formed of polysilicon, the buried sacrificial layer 110 is removed using XeF2. If the filling sacrificial layer 110 is formed of oxide, the filling sacrificial layer 110 is removed using gas phase etch (GPE). The order of processes of forming the first pad electrodes 116 and the first sealing parts 118, forming the vias 122 and the third pad electrodes 124, and removing the filling sacrificial layer 110 may be freely varied.

Referring to FIG. 8, the MEMS driving electronic device 200 including the substrate 202 having the second pad electrodes 206 and the second sealing parts 208 respectively corresponding to the first pad electrodes 116 and the first sealing parts 118 is provided. The substrate 202 includes the front and back surfaces 202a and 202b, the chip part 204 formed on the front surface 202a, the second pad electrodes 206 formed around the chip part 204, and the second sealing parts 208 formed at the edge of the substrate 202. The MEMS driving electronic device 200 is sealed with and bonded to the MEMS device 100 through the connectors 102 to form the air gap having the predetermined width. The MEMS device 100 and the MEMS driving electronic device 200 are boned to each other, facing each other, using heat and pressure. After bonding, the metal balls 128 are formed on the third pad electrodes 124 to connect the MEMS package to an external substrate so as to complete the MEMS package.

Figure 9:
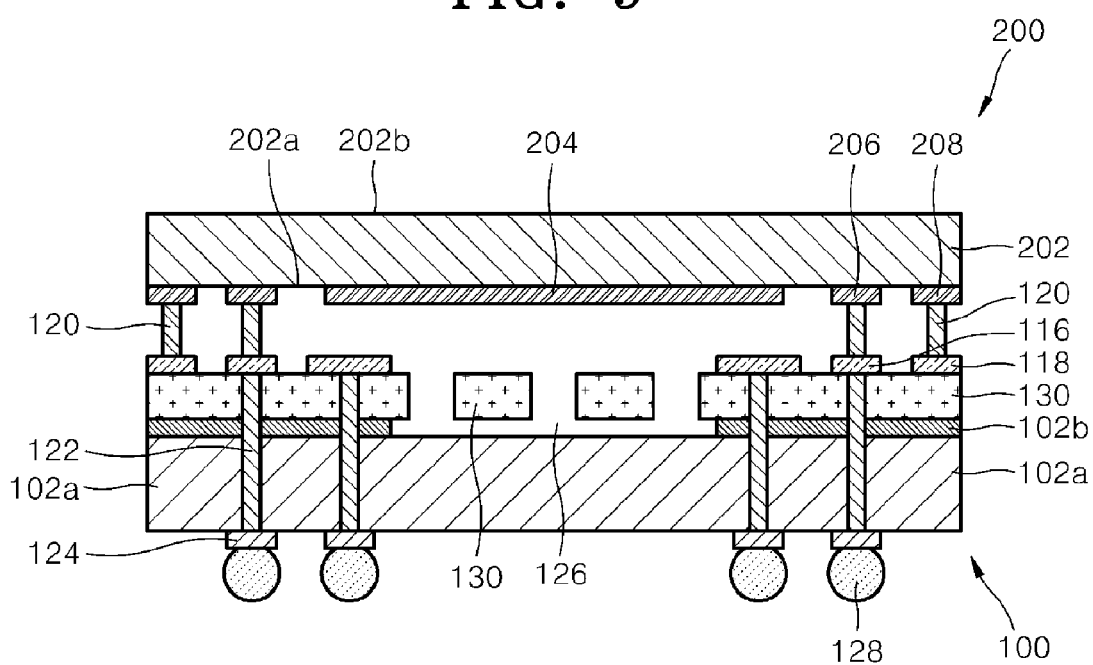
FIG. 9 is a cross-section view of an MEMS package according to another embodiment of the present invention.

FIG. 9 is a cross-section view of an MEMS package according to another embodiment of the present invention.

In detail, the MEMS package of FIG. 9 is the same as the MEMS package of FIG. 1 except that a substrate constituting an MEMS device 100 is an SOI substrate and MEMS structures 130 are formed of silicon epitaxial patterns. The same reference numerals of FIG. 9 as those of FIG. 1 denote the same elements. An MEMS driving electronic device 200 of FIG. 9 is the same as the MEMS driving electronic device 200 of FIG. 1. Also, a connection relationship between the MEMS device 100 and the MEMS driving electronic device 200 of FIG. 9 is the same as a connection relationship between the MEMS device 100 and the MEMS driving electronic device 200 of FIG. 1. Thus, their detailed descriptions will be omitted herein.

Figure 10:
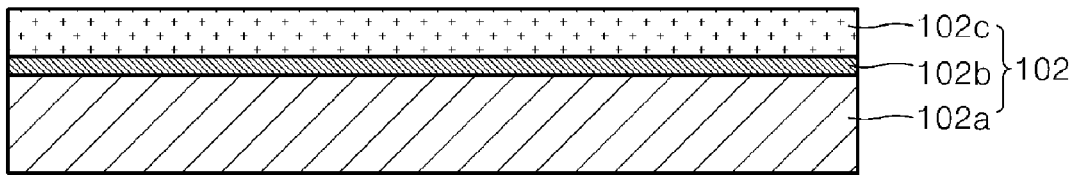
FIGS. 10 through 16 are cross-sectional views illustrating a method of packaging the MEMS package of FIG. 9.

Referring to FIG. 10, in the MEMS device 100, a silicon epitaxial layer 102c of an SOI substrate 102 is selectively etched to form silicon epitaxial patterns so as to form the MEMS structures 130 formed of the silicon epitaxial patterns. The MEMS structures 130 are disposed above a space part 126 which is formed by selectively etching an oxide layer 102b of the SOI substrate 102. First pad electrodes 116 and first sealing parts 118 are formed on the MEMS structures 130 of the SOI substrate 102. The first pad electrodes 116 are formed around the MEMS structures 130 formed above the space part 126 and thus used to drive the MEMS structures 130. The first sealing parts 118 are formed at the edge of the SOI substrate 102. The first sealing parts 118 are used to seal the MEMS device 100 with the MEMS driving electronic device 200.

Connectors 120 are formed on the first pad electrodes 116 and the first sealing parts 118. Vias 122 are formed in the MEMS structures 130 of the SOI substrate 102, the oxide layer 102b, and a base silicon substrate 102a. Third pad electrodes 124 and metal balls 128 are formed on the vias 122 to be connected to an external substrate (not shown). Thus, the first pad electrodes 116 are connected to the vias 122.

FIGS. 10 through 16 are cross-sectional views illustrating a method of packaging the MEMS package of FIG. 9.

Figure 11:
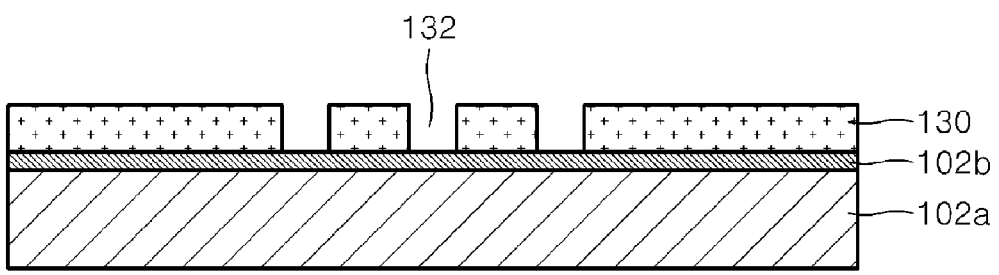

Referring to FIG. 10, the SOI substrate 102 including the base silicon substrate 102a, the oxide layer 102b, and the silicon epitaxial layer 102c is provided. Referring to FIG. 11, the silicon epitaxial layer 102c is patterned to form holes 132 exposing the oxide layer 102b and the MEMS structures 130 formed of the silicon epitaxial patterns.

Figure 12:
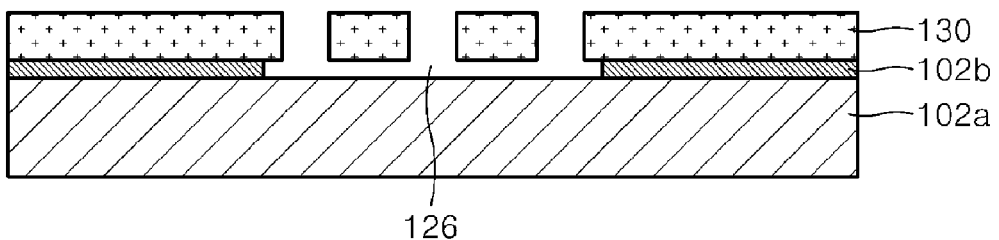
Figure 13:
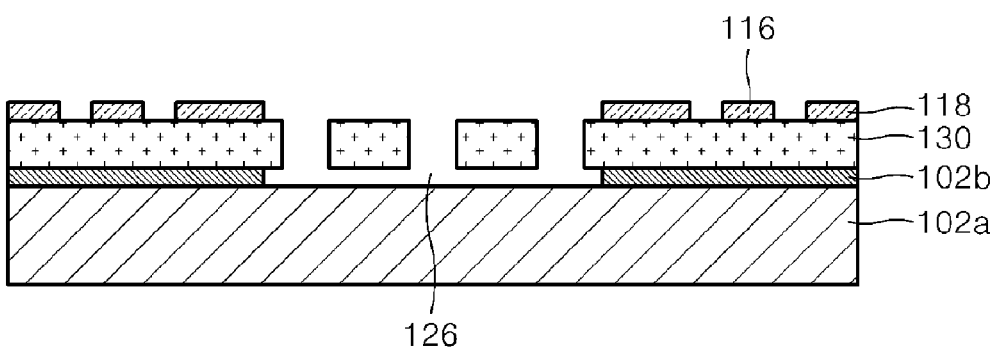

Referring to FIG. 12, portions of the oxide layer 102b below the holes 132 are selectively etched to form the space part 126 under the MEMS structures 130. Thus, the MEMS structures 130 are formed above the space part 126. Referring to FIG. 13, the first pad electrodes 116 and the first sealing parts 118 are formed around the MEMS structures 132 that are above the space part 126.

Figure 14:
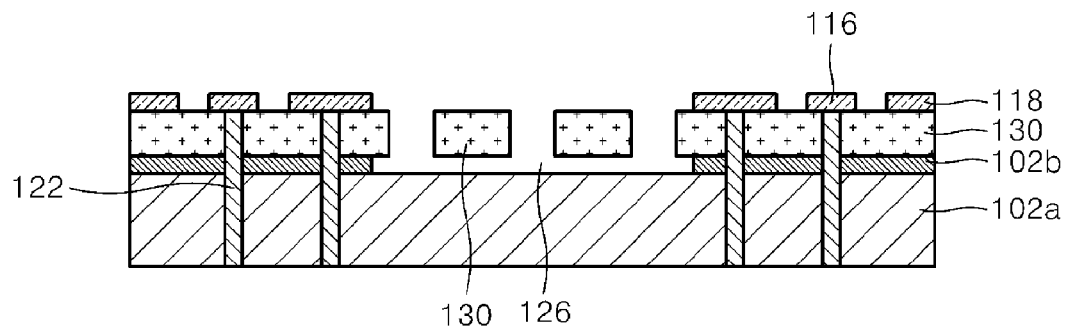
Figure 15:
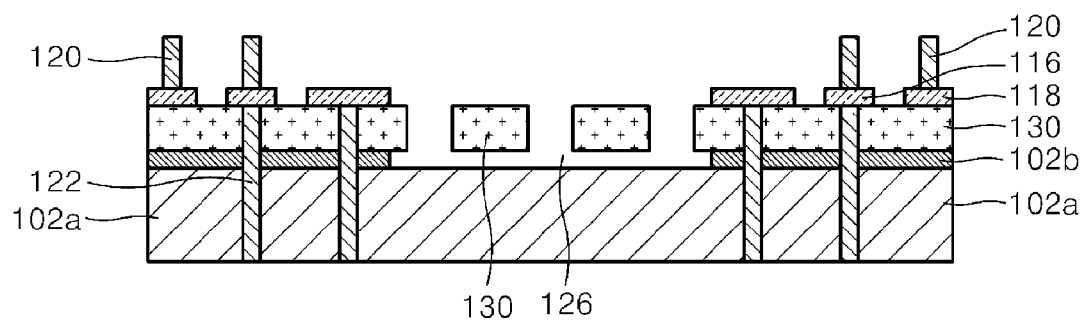

Referring to FIG. 14, the vias 122 are formed in the MEMS structures 130 underneath the first electrode pads 116, the oxide layer 102b, and the base silicon substrate 102a. The SOI substrate 102 is selectively etched to form the vias 122. DRIE is selectively performed on a back surface of the SOI substrate 102 to form viaholes, and then a metal layer is filled in the viaholes so as to form the vias 122. Referring to FIG. 15, the connectors 120 are formed on the first pad electrodes 116 and the first sealing parts 118. Orders of processes of forming the first pad electrodes 116 and the first sealing parts 118 and forming the vias 122 and the third pad electrodes 124 may freely vary.

Figure 16:
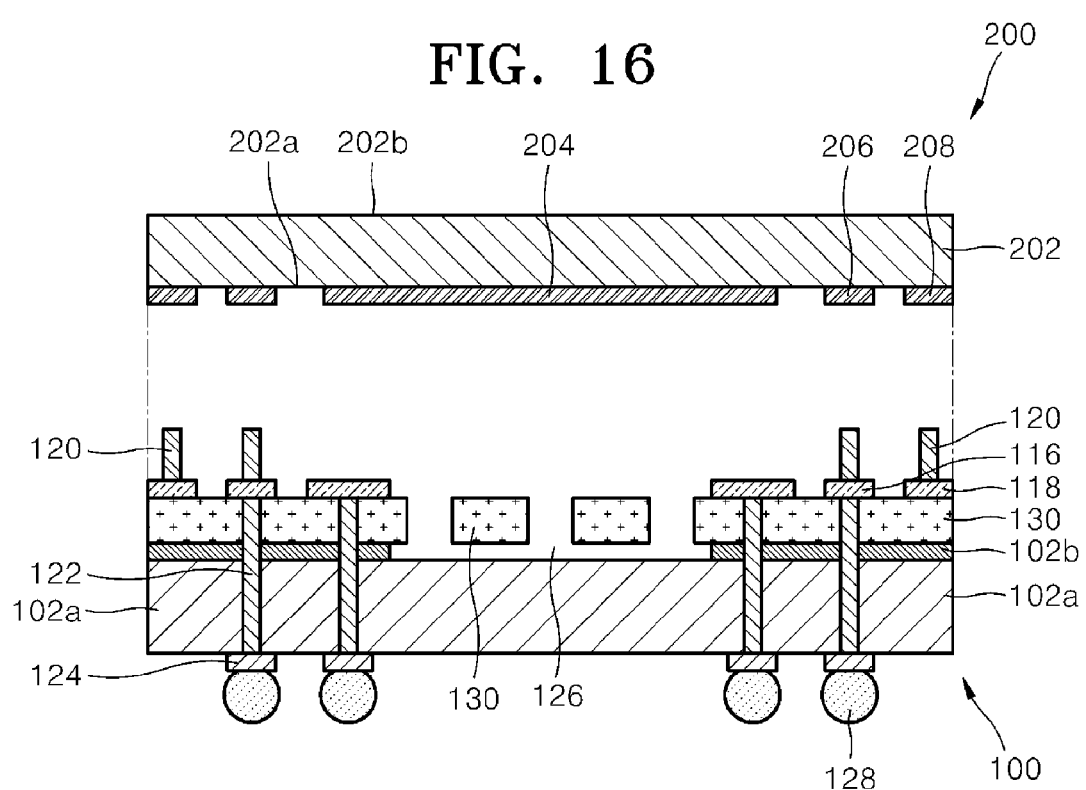

Referring to FIG. 16, the MEMS driving electronic device 200 including second pad electrodes 206 and 208 is sealed with and bonded to the MEMS device 100 through the connectors 120 to form an air gap having a predetermined width as illustrated in FIG. 8. The MEMS device 100 and the MEMS driving electronic device 200 are bonded to each other to face each other using heat and pressure. After bonding, the metal balls 128 are formed on the third pad electrodes 124 to be connected to an external substrate so as to complete the MEMS package.

Figure 17:
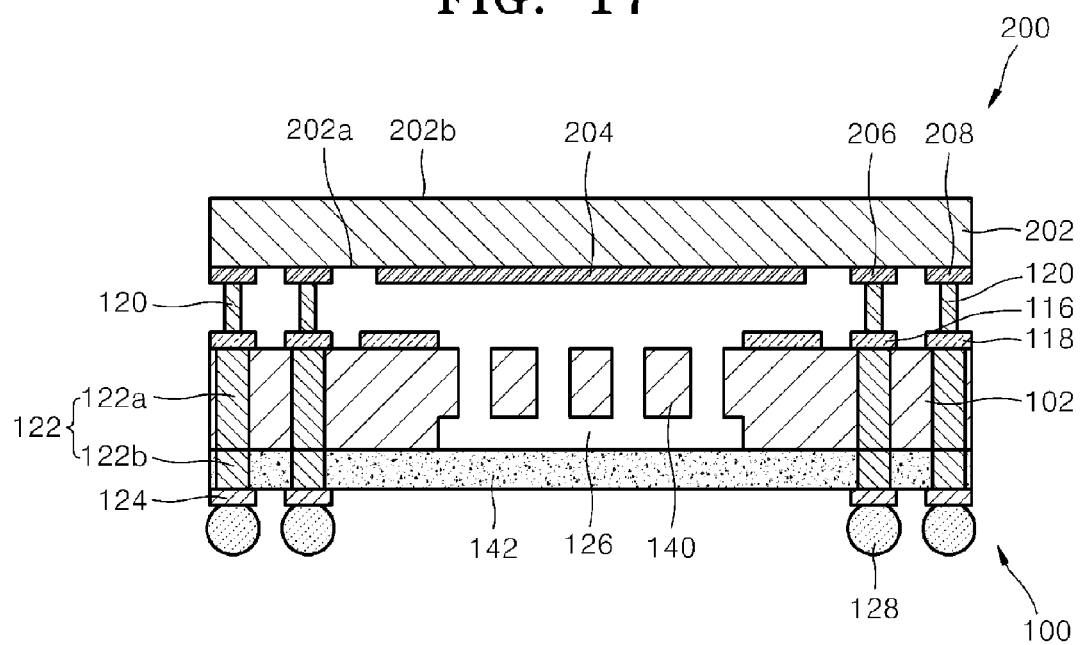
FIG. 17 is a cross-section view of an MEMS package according to another embodiment of the present invention.

FIG. 17 is a cross-section view of an MEMS package according to another embodiment of the present invention.

In detail, the MEMS package of FIG. 17 is the same as that of FIG. 1 except that a space part 126 is formed in a silicon substrate 102 constituting an MEMS device 100 and a portion of the silicon substrate 102 is etched to form silicon patterns in a separated state so as to form MEMS structures 140. The same reference elements of FIG. 17 as those of FIG. 1 denote the same elements. An MEMS driving electronic device 200 of FIG. 17 is the same as that of FIG. 1, and a connection relationship between the MEMS device 100 and the MEMS driving electronic device 200 of FIG. 17 is the same as that of the MEMS device 100 and the MEMS driving electronic device 200 of FIG. 1. Thus, their detailed descriptions will be omitted herein.

In the MEMS device 100, the space part 126 is formed in a lower part of the silicon substrate 102, and the MEMS structures 140 are formed of the silicon patterns above the space part 126. The SOI substrate 102 is etched to form the MEMS structures 140. A cap layer 142 is formed underneath the space part 126 and the silicon substrate 102 to seal the space part 126. First pad electrodes 116 and first sealing parts 118 are formed on the silicon substrate 102 around the MEMS structures 140. The first pad electrodes 116 are formed around the MEMS structures 140 formed above the space part 126, and the first sealing parts 118 are formed at edges of the MEMS structures 140. The first sealing parts 118 are used to seal the MEMS device 100 with the MEMS driving electronic device 200.

Connectors 120 are formed on the first pad electrodes 116 and the first sealing parts 118. Vias 122 including first and second vias 122a and 122b are formed in the silicon substrate 102 and the cap layer 142. Third pad electrodes 124 and metal balls 128 are formed on the vias 122 to be connected to an external substrate (not shown). Thus, the first pad electrodes 116 are connected to the vias 122.

FIGS. 18 through 25 are cross-sectional views illustrating a method of packaging the MEMS package of FIG. 17.

Figure 18:
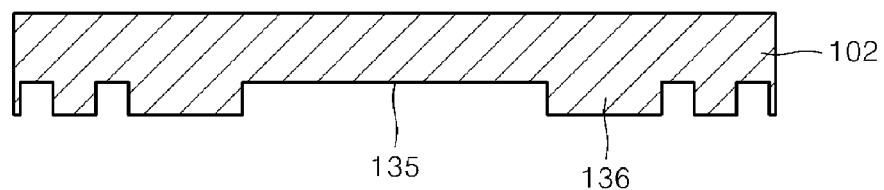
FIGS. 18 through 25 are cross-sectional views illustrating a method of packaging the MEMS package of FIG. 17.
Figure 19:
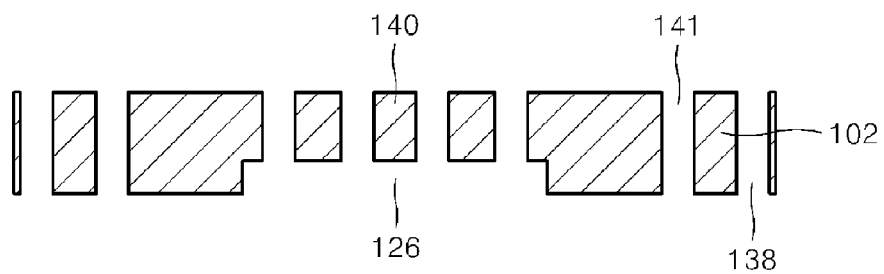

Referring to FIG. 18, the silicon substrate 102 is provided. A back surface of the silicon substrate 102 is selectively etched to form a mask pattern 136 having a recessed part 135. Referring to FIG. 19, the silicon substrate 102 is etched using the mask patterns 136 as masks to form the MEMS structures 140, the space part 126, and viaholes 138 and 141, wherein the MEMS structures 140 are formed of silicon oxide patterns above a space part 126.

Figure 20:
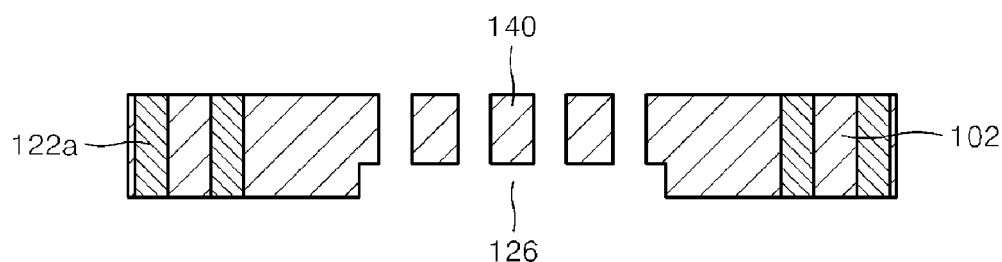
Figure 21:
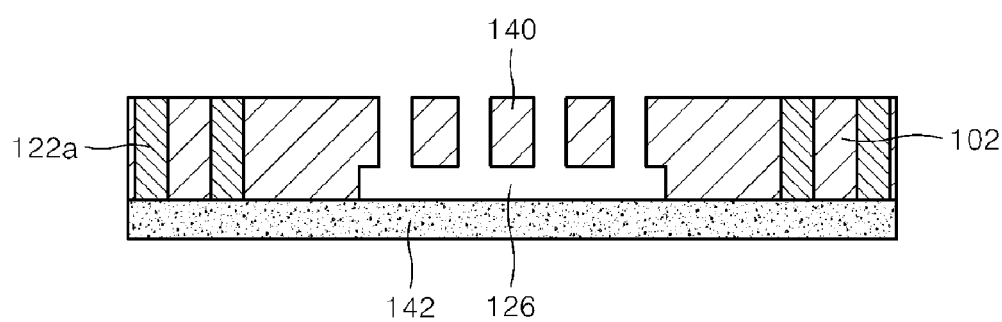

Referring to FIG. 20, the first vias 122a are formed in the viaholes 138 and 141 around the MEMS structures 140. In other words, the first vias 122a are formed in the viaholes 138 and 141 around the space part 126. Referring to FIG. 21, the cap layer 142 is formed on the back surface of the silicon substrate 102 to seal the space part 126. Polyimide, dry film resist (DFR), or liquid crystal polymer (LCP) is stacked on and then adhered to the back surface of the silicon substrate 102 to form the cap layer 142. The cap layer 142 is formed on the back surface of the silicon substrate 102 in FIG. 21 but may be formed on a front surface of the silicon substrate 102. In this case, corresponding elements may be formed in an opposite way to the way shown here.

Figure 22:
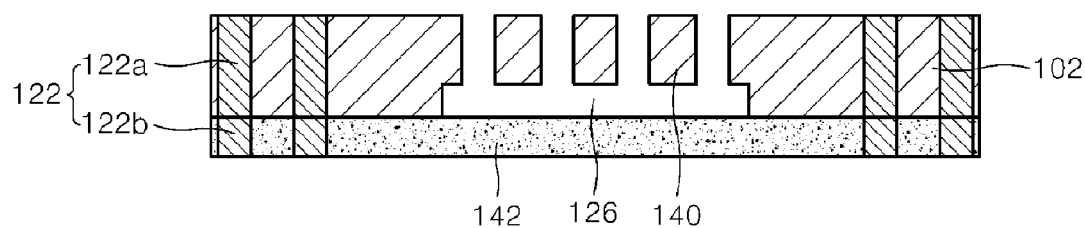

Referring to FIG. 22, the second vias 122b are formed in the cap layer 142 to be connected to the first vias 122a so as to form the vias 122 including the first and second vias 122a and 122b. If the cap layer 142 is formed of polyimid or DFR, second viaholes (not shown) are formed, and then a conductive material is filled in the second viaholes to form the second vias 122b. If the cap layer 142 is formed of LCP, the cap layer 142 is selectively etched to form second viaholes (not shown), and then a conductive material is filled in the second viaholes so as to form the second vias 122b.

Figure 23:
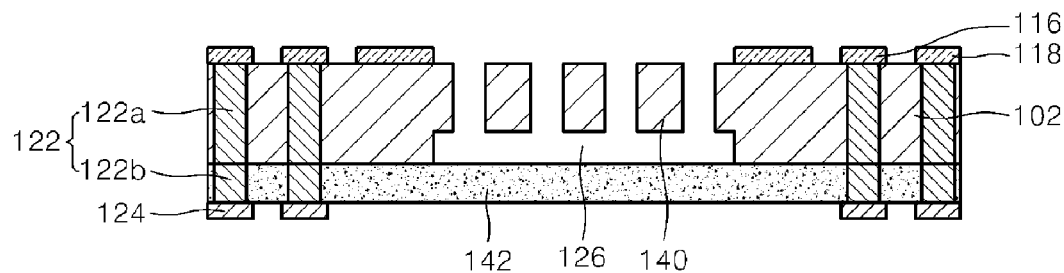
Figure 24:
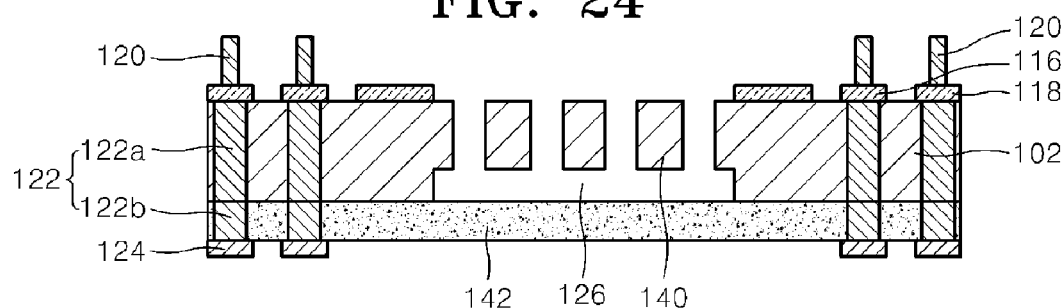

Referring to FIG. 23, the first pad electrodes 116 and the first sealing parts 118 are formed on surfaces of the first vias 122a. The first pad electrodes 116 are formed around the MEMS structures 140, and the first sealing parts 118 are formed at the edge of the silicon substrate 102. The third pad electrodes 124 are formed on surfaces of the second vias 122b. Referring to FIG. 24, the connectors 120 are formed on the first pad electrodes 116 and the first sealing parts 118.

Figure 25:
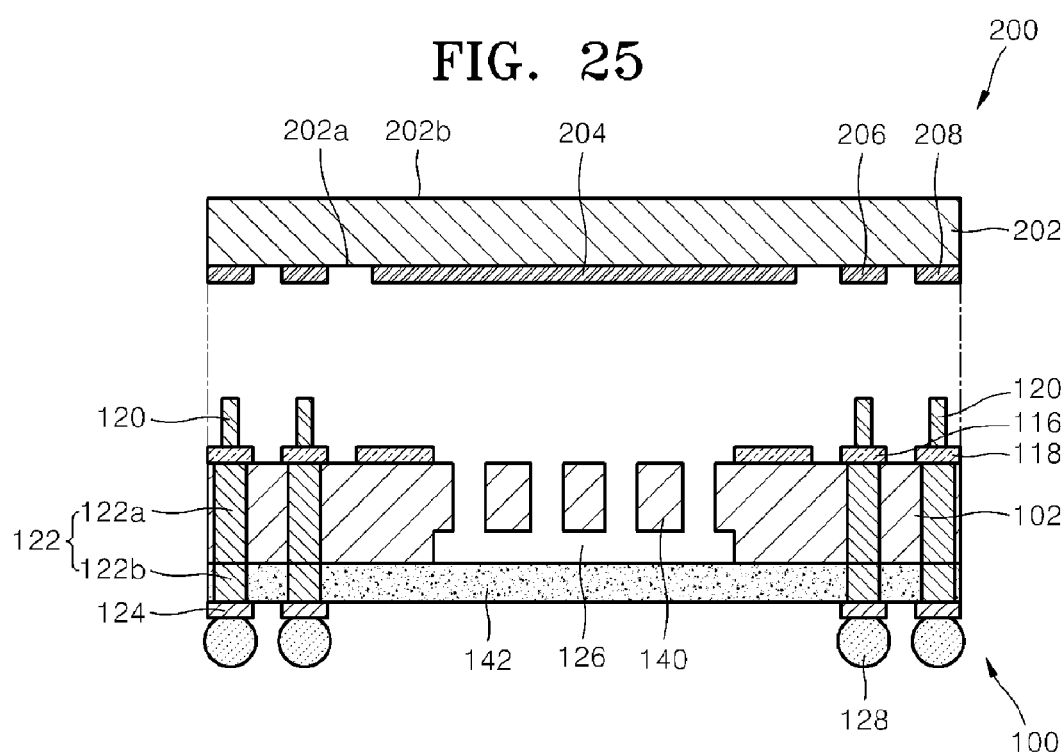

Referring to FIG. 25, the MEMS driving electronic device 200 including second pad electrodes 206 and second sealing parts 208 is sealed with and bonded to the MEMS device 100 through connectors 102 to form an air gap having a predetermined width as illustrated in FIG. 8. The MEMS device 100 and the MEMS driving electronic device 200 are bonded to each other to face each other using heat and pressure. After bonding, the metal balls 128 are formed on the third pad electrodes 124 to be connected to an external substrate so as to complete the MEMS package.

As described above, according to the present invention, an MEMS device can be directly bonded to an MEMS driving electronic device to improve yield. Also, an MEMS package can be manufactured on a wafer or chip level. In addition, effects of a parasitic resistance and a parasitic capacitance can be reduced to reduce the SNR of the MEMS device.

Moreover, the MEMS device can be packaged and then bonded to the MEMS driving electronic device so as to realize a dual package structure. Thus, time and cost required for packaging can be saved to improve productivity.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

The present invention provides a Micro Electro-Mechanical System (MEMS) package capable of reducing effects of a parasitic resistance and a parasitic capacitance. The present invention provides a MEMS package enabling chip level or wafer level packaging, and preventing a reduction in a manufacturing yield. The present invention also provides a method of easily packaging an MEMS package.

The invention claimed is:

1. A MEMS (Micro Electro-Mechanical System) package comprising:
    a MEMS device comprising MEMS structures formed on a substrate, first pad electrodes driving the MEMS structures, first sealing parts formed at an edge of the substrate, and connectors formed on the first pad electrodes and the first sealing parts; and
    a MEMS driving electronic device comprising second pad electrodes and second sealing parts respectively corresponding to the first pad electrodes and the first sealing parts to be sealed with and bonded to the MEMS device through the connectors to form an air gap having a predetermined width.

2. The MEMS package of claim 1, wherein the substrate of the MEMS device is a silicon substrate, and the MEMS device comprises a recessed part formed in the silicon substrate and the MEMS structures formed above the recessed part.

3. The MEMS package of claim 2, wherein the MEMS structures are silicon nitride patterns or polysilicon patterns.

4. The MEMS package of claim 1, wherein the substrate of the MEMS device is an SOI substrate, and the MEMS device comprises a space part and the MEMS structures, wherein an oxide layer of the SOI substrate is selectively etched to form the space part, and a silicon epitaxial layer of the SOI substrate is selectively etched to form silicon epitaxial patterns above the space part so as to form the MEMS structures of the silicon epitaxial patterns.

5. The MEMS package of claim 1, wherein the substrate of the MEMS device is a silicon substrate, and the MEMS device comprises a space part, MEMS structures, and a cap layer, wherein the space part is formed in the silicon substrate, the silicon substrate is etched to form silicon patterns above the space part so as to form the MEMS structures of the silicon patterns, and the cap layer is formed on one of front and back surfaces of the silicon substrate to seal the recessed part.

6. The MEMS package of claim 5, wherein the first pad electrodes of the MEMS device are connected to first vias formed in the substrate, second vias are connected to the first vias, and third pad electrodes and metal balls are formed on the second vias to be connected to an external substrate.

7. The MEMS package of claim 1, wherein the first pad electrodes of the MEMS device are connected to vias formed in the substrate, and third pad electrodes and metal balls are formed on the vias to be connected to an external substrate.

8. A method of packaging an MEMS device and an MEMS driving electronic device, comprising:
    forming MEMS structures above a substrate, forming first pad electrodes driving the MEMS structures, and forming first sealing parts at an edge of the substrate;
    forming connectors on the first pad electrodes and the first sealing parts to form the MEMS device; and
    sealing the MEMS driving electronic device with and bonding the MEMS driving electronic device to the MEMS device through the connectors to form an air gap having a predetermined width, wherein the MEMS driving electronic device comprises second pad electrodes and second sealing parts respectively corresponding to the first pad electrodes and the first sealing parts.

9. The method of claim 8, wherein if the substrate of the MEMS device is a silicon substrate, the forming of the MEMS device comprises:
    selectively etching the silicon substrate to form a recessed part;
    forming a sacrificial layer in the recessed part;
    forming the MEMS structures above the sacrificial layer and the silicon substrate;
    forming the first pad electrodes and the first sealing parts on the MEMS structures; and
    removing the sacrificial layer to form a space part below the MEMS structures.

10. The method of claim 9, wherein the forming of the MEMS structures comprises:
   forming a MEMS structure layer on the sacrificial layer and the silicon substrate; and
   patterning the MEMS structure layer.

11. The method of claim 10, wherein the sacrificial layer and the MEMS structures are formed of polysilicon and silicon nitride, respectively, or formed of oxide and polysilicon, respectively.

12. The method of claim 8, wherein if the substrate of the MEMS device is an SOI substrate, the forming of the MEMS device comprises:
   patterning a silicon epitaxial layer of the SOI substrate to form the MEMS structures of silicon epitaxial patterns; and
   selectively etching an oxide layer of the SOI substrate under the MEMS structures to form a space part below the silicon epitaxial patterns.

13. The method of claim 8, wherein if the substrate of the MEMS device is a silicon substrate, the forming of the MEMS device comprises:
   selectively etching the silicon substrate to form a recessed part;
   etching the silicon substrate to form MEMS structures of silicon patterns above the recessed part; and
   forming a cap layer on one of front and back surfaces of the silicon substrate to form a space part above or below the MEMS structures.

14. The method of claim 13, further comprising:
   forming first vias in the substrate under the first pad electrodes of the MEMS device;
   forming second vias in the cap layer, wherein the second vias are connected to the first vias; and
   forming third pad electrodes and metal balls on the second vias, wherein the third pad electrodes and the metal balls are connected to an external substrate.

15. The method of claim 8, further comprising:
   forming vias in the substrate under the first pad electrodes of the MEMS device; and
   forming third pad electrodes and metal balls on the vias, wherein the third pad electrodes and the metal balls are connected to an external substrate.

* * * * *